United States Patent [19]
Rozman et al.

[11] Patent Number: 5,136,544
[45] Date of Patent: Aug. 4, 1992

[54] COMPUTER MEMORY WITH STATUS CELL

[75] Inventors: Rodney R. Rozman, Placerville; Duane R. Mills, Folsom, both of Calif.

[73] Assignee: Intel Corporation, Santa Clara, Calif.

[21] Appl. No.: 589,388

[22] Filed: Sep. 26, 1990

[51] Int. Cl.⁵ .............................................. G11C 13/00
[52] U.S. Cl. ..................................... 365/201; 365/154
[58] Field of Search ............ 365/201, 154, 156, 189.04

[56] References Cited
U.S. PATENT DOCUMENTS 5,086,413 2/1992 Tsube et al. ......................... 365/201

*Primary Examiner*—Terrell W. Fears
*Attorney, Agent, or Firm*—Blakely, Sokoloff, Taylor & Zafman

[57] ABSTRACT

A memory device is described. The memory device includes a memory array. A configuration cell configures the memory device with respect to memory device operation. The configuration cell is coupled to various internal circuits of the memory device. The configuration cell is initially in a first state and can selectably be placed into a second state. Once the configuration cell is placed into the second state, the configuration cell is impeded from returning to the first state. A status cell is initially in a third state and can selectably be placed into a fourth state. Once the status cell is placed into the fourth state, the status cell is impeded from returning to the third state. A control circuit is coupled between the status cell and the configuration cell. If the memory device is in a standby mode, and the status cell is in the third state, then the control circuit turns off the current of the configuration cell. A method of testing a memory device is also described.

5 Claims, 3 Drawing Sheets

FIG_1 (PRIOR ART)
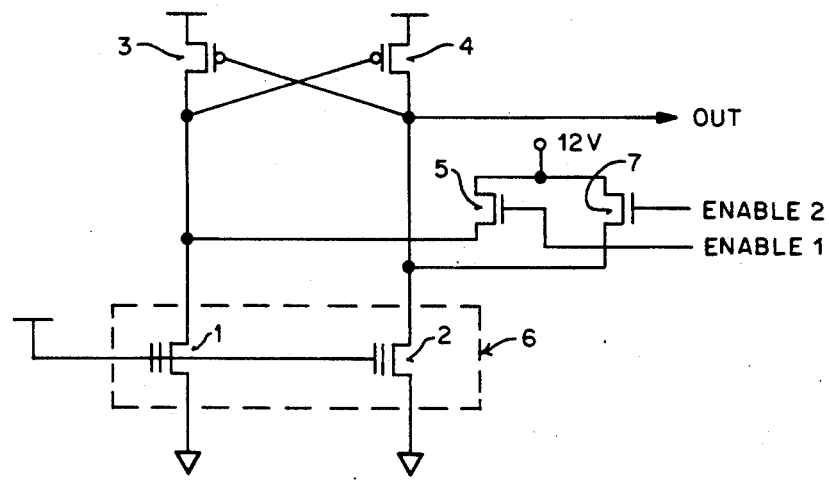
FIG_2
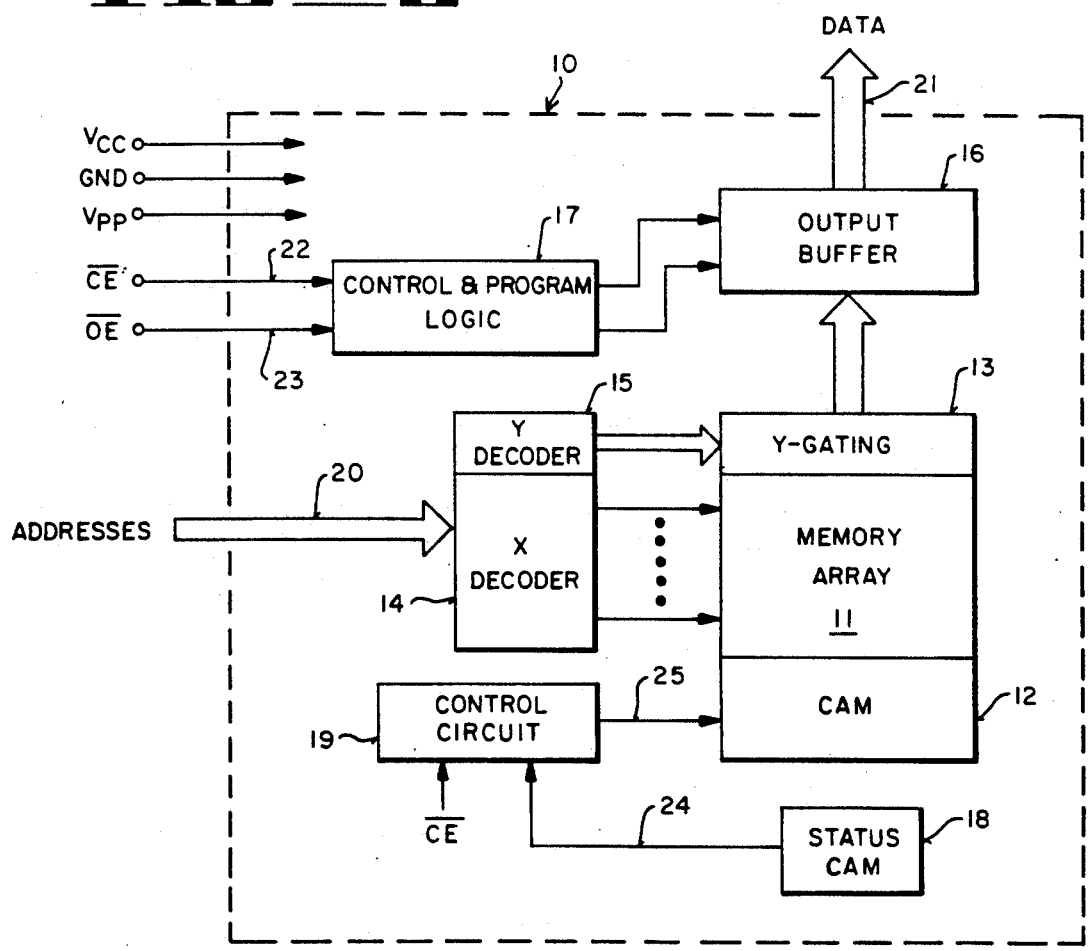

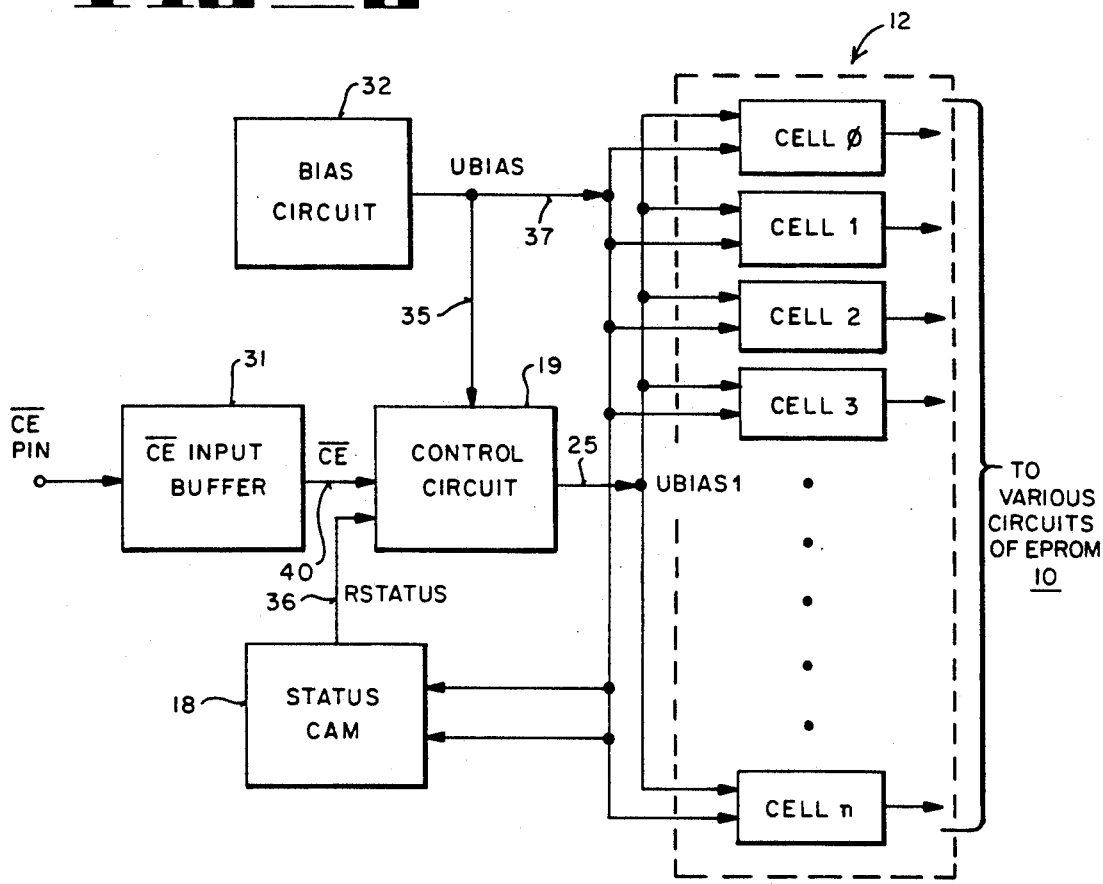
FIG_3
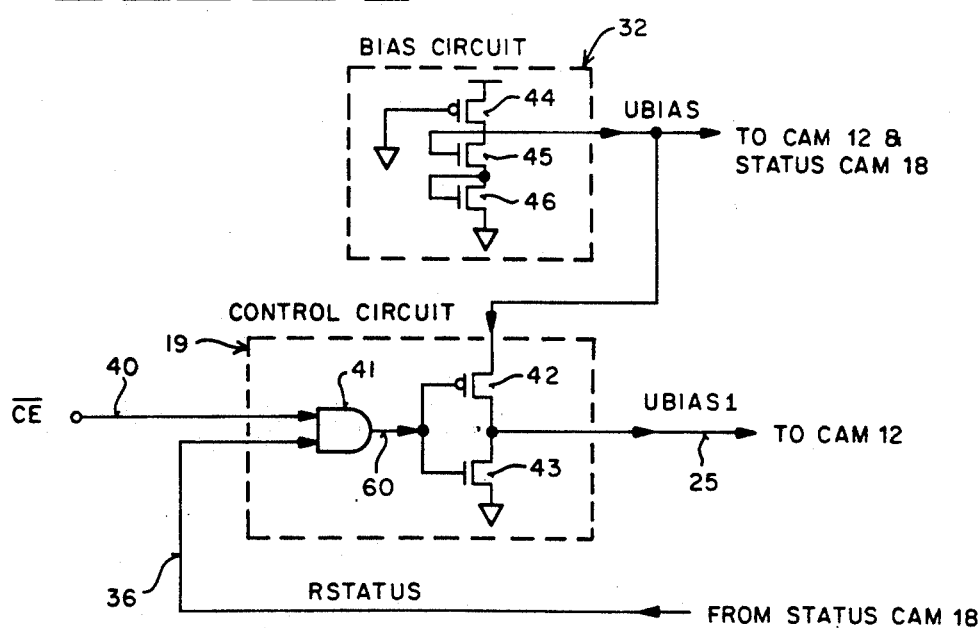
FIG_4

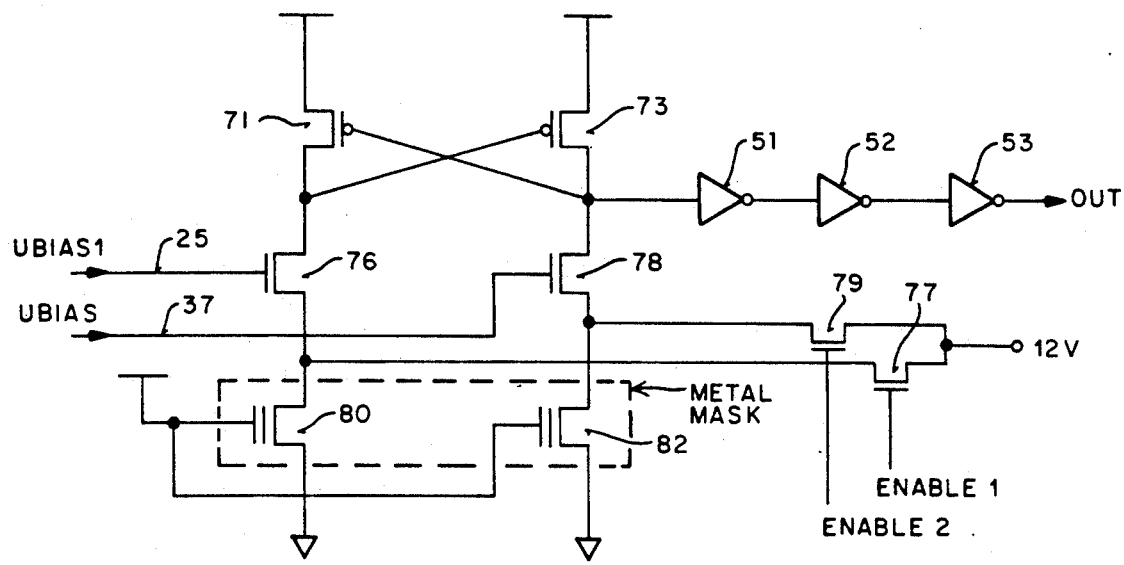
FIG_5
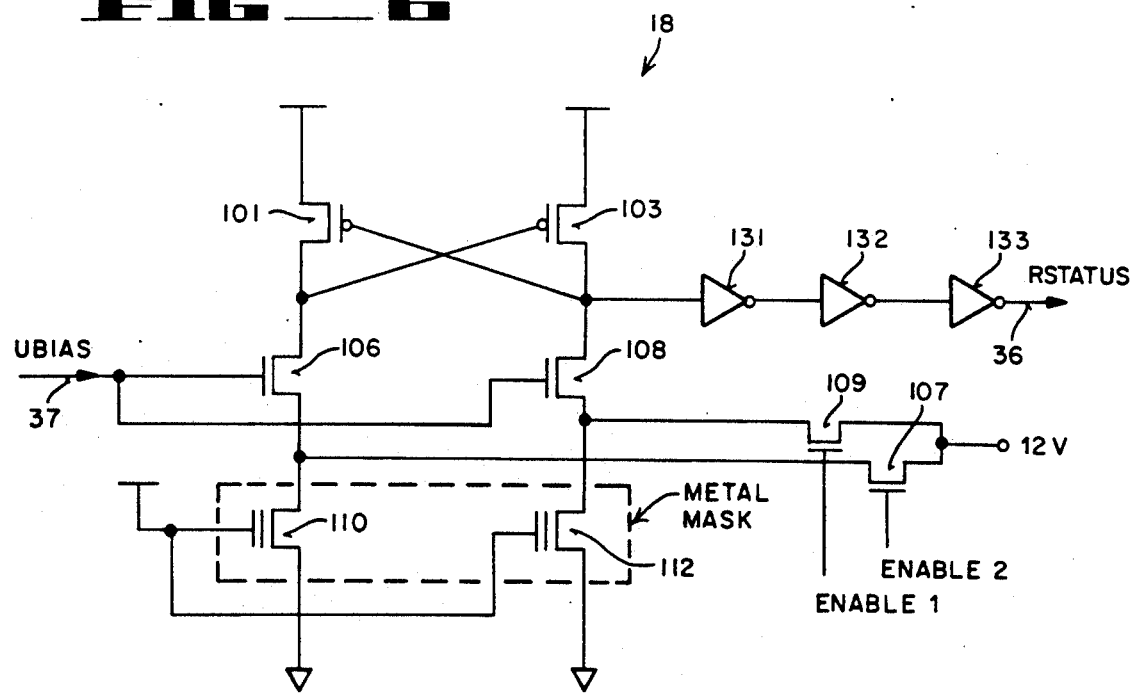
FIG_6

COMPUTER MEMORY WITH STATUS CELL

FIELD OF THE INVENTION

The present invention pertains to the field of computer memories. More particularly, this invention relates to circuitry and a method for a memory device in which the standby power consumption of the memory device can be measured without prior programming of its configuration bits.

BACKGROUND OF THE INVENTION

One type of prior art non-volatile computer memory is the Erasable Programmable Read-Only Memory ("EPROM"). The EPROM can be programmed by a user. Once programmed, the EPROM retains its data until erased. Ultraviolet light erasure of the EPROM erases the entire contents of the memory. The memory may then be reprogrammed with new data.

One type of prior art computer memory package contains content addressable memory ("CAM") in addition to a main memory array. The main memory array is an EPROM memory, but the content addressable memory is formed by EPROM-type cells that are covered with a layer of metal. This metal layer blocks ultraviolet light from shining on the cells. Therefore, once the CAM cells are programmed, they cannot be erased by ultraviolet light. The CAM cells are thus permanently programmed. The CAM cells are of the type of memory called Unerasable Programmable Read-Only Memory ("UPROM").

In one type of prior art computer memory, the CAM cells are used to perform certain configuration and management functions. The CAM cells are programmed before the memory package reaches the end user as a final product. The CAM cells can be programmed to configure the memory device with respect to the device operation (for example, latched inputs, CEBTTL active high, OEBTTL active high, etc.). The CAM cells can also be used to activate (or deactivate) redundancy cells with respect to the main memory array. The redundancy cells are used in place of defective cells of the main memory array.

FIG. 1 is a circuit diagram of one prior art CAM cell. The CAM cell is formed by two N type of EPROM transistors 1 and 2. Transistors 1 and 2 each have floating gates. The floating gates physically reside underneath the control gates of the transistors. Transistors 5 and 7 are controlled by signals ENABLE 1 and ENABLE 2 to apply a high voltage of 12V to the drain of transistors 1 and 2 respectively.

Initially, both transistors 1 and 2 are in the erased state. In the erased state, transistors 1 and 2 are each in the conducting state. To program the CAM cell to a logical "zero" state, a high voltage of 12 volts is applied to the control gate transistor 1. The 12 volt high voltage is also applied to the drain of transistor 1 via transistor 5 by the active high ENABLE 1 signal applied to the gate of transistor 5. This results in electrons being deposited on the floating gate of transistor 1. The electrons deposited on the floating gate of transistor 1 cause the threshold of transistor 1 to be raised. This causes transistor 1 to become non-conducting, which causes the CAM cell output to be a logical "zero." Similarly, to program the CAM cell to a logical "one" state, the high voltage is applied to the control gate and drain of transistor 2. This causes transistor 2 to become non-conducting, which in turn makes the CAM cell output a logical "one" output signal.

For EPROM cells that are not CAM's, the application of ultraviolet light to the gates of the transistors programmed to a logical zero state would remove the electrons deposited on the floating gates of those transistors, and the transistors would switch from the non-conducting state to the conducting state. For the prior art CAM cell of FIG. 1, however, a metal layer 6 covers the gates of transistors 1 and 2 and prevents ultraviolet light from striking the gates of transistors 1 and 2. This prevents transistors 1 and 2 from being erased once transistors 1 and 2 are programmed to a logical zero state.

In the prior art, EPROMs are used in various types of systems, including systems wherein extremely low power consumption is required. To lower the power consumption of the EPROM, certain prior art EPROMs can be placed in a standby mode during the times the EPROMs are not being accessed. In the standby mode, certain internal circuits of the EPROMs are powered down. This significantly reduces the power consumption of the EPROMs. The standby mode is triggered by applying a high voltage of Vcc to the "chip enable" pin of the particular EPROM.

Before at least one prior art EPROM is shipped by the manufacturer, a series of tests are conducted to determine whether the EPROM meets its device specifications. Two of the specifications relate to standby current and standby power of the EPROM when the EPROM is in the standby mode. The EPROMs not meeting the specifications as to standby current and standby power are rejected.

Disadvantages are associated with the testing of standby current and standby power before the above-referenced prior art EPROMs are shipped. If the CAM cells of the EPROM device are not programmed before the device is tested, then standby current and standby power cannot be accurately measured. This follows from the fact that when the CAM cells are erased, they are all in the logical one state and are conducting. Each CAM cell that is programmed becomes non-conducting, however. Thus the programming of CAM cells changes the standby current and power.

On the other hand, if the CAM cells are programmed before the EPROM is tested, then standby current and standby power can be accurately measured. But the CAM cells once programmed cannot be reprogrammed. This may restrict the uses of the EPROM available to end users. Furthermore, the programming of the CAM cells is time-consuming and increases the cost of the EPROM. Moreover, if the standby current and standby power of the device tested does not meet the specifications, then the EPROM is rejected and the time-consuming programming has been spent on a rejected device.

SUMMARY AND OBJECTS OF THE INVENTION

One of the objectives of the present invention is to provide circuitry and a method for determining power consumption of a memory device in the standby mode without the necessity of prior programming configuration bits of the memory device.

A memory device is described. The memory device includes a memory array. A configuration cell is provided for configuring the memory device with respect to memory device operation. The configuration cell is initially in a first state and can selectably be placed into a second state. Once the configuration cell is placed into the second state, the configuration cell is impeded from returning to the first state. A status cell is also provided in the memory device. The status cell is initially in a third state and can selectably be placed into a fourth state. The status cell is impeded from returning to the third state. A control circuit is coupled between the status cell and the configuration cell. If the memory device is in a standby mode and the status cell is in the third state, then the control circuit turns off the current of the configuration cell.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements and in which:

FIG. 1 is a circuit diagram of one prior art CAM cell of an EPROM device.

FIG. 2 is a block diagram of an EPROM device.

FIG. 3 is a block diagram of circuitry that includes a status CAM, control circuitry, and a plurality of CAM cells of the EPROM.

FIG. 4 illustrates the circuitry of the control circuitry of FIG. 3.

FIG. 5 illustrates one of the CAM cells of FIG. 3.

FIG. 6 is a schematic diagram of a status CAM cell.

DETAILED DESCRIPTION

FIG. 2 is a block diagram of EPROM 10 that includes status CAM 18 and CAM cells 12, described in more detail below. EPROM 10 includes memory array 11, which is made up of memory cells that store data at addresses. In one embodiment of the present invention, memory array 11 can store 256K ("Kilobits") of data. In alternative embodiments, memory array 11 can be larger or smaller than 256K. In a preferred embodiment, EPROM 10 employs CHMOS circuitry.

Vpp is the program power supply voltage for EPROM 10. Vcc is the chip power supply for EPROM 10. In one embodiment, Vpp is approximately 12 volts and Vcc is approximately 5 volts.

In absence of a 12 volt being applied to Vpp, EPROM 10 acts as a read only memory. Addresses are sent on address bus 20 to X and Y decoders 14 and 15. The data stored at an address decoded by X and Y decoders 14 and 15 is read from memory array 11 and applied to output buffer 16. The data is then made available to external circuitry via data bus 21.

EPROM 10 includes chip enable pin $\overline{CE}$ and output enable pin $\overline{OE}$. Chip enable pin $\overline{CE}$ is a power control and is used for device selection. Output enable pin $\overline{OE}$ is an output control pin and is used to gate data from the output pins of EPROM 10 independent of device selection. Both of the control pins $\overline{CE}$ and $\overline{OE}$ must be logically low in order to obtain data at the outputs of EPROM 10. Both chip enable pin $\overline{CE}$ and output enable pin $\overline{OE}$ are connected, via lines 22 and 23 respectively, to control and program logic 17. When the chip enable pin $\overline{CE}$ is applied with the high voltage Vcc, EPROM 10 enters the standby mode. In the standby mode, certain internal circuits are powered down. As a result, power consumption by EPROM 10 is substantially reduced.

EPROM 10 also includes CAM cells 12, which are located peripherally to memory array 11. CAM cells 12 are formed from EPROM-type cells covered with metal layer to prevent the CAM cells, once programmed, from being erased. The CAM cells 12 are used to perform configuration and management functions for EPROM 10. The CAM cells can be programmed to configure the operation of EPROM 10. CAM cells 12 are also used to activate (or deactivate) redundancy cells located within memory array 11. The redundancy cells are used to replace defective cells of memory array 11. All CAM cells 12 are initially erased. Once any cell of CAM cells 12 is programmed to a logical zero or logical one state, that cell permanently remains at that state and cannot be reprogrammed.

EPROM 10 has a plurality of operating modes. A read mode is initiated by the user when both chip enable input pin $\overline{CE}$ and output enable input pin $\overline{OE}$ are set to a logical low state. When EPROM 10 is in the read mode, data stored in memory array 11 can be read. A programming mode is initiated when a 12 volt Vpp is applied to EPROM 10. When EPROM 10 is in the programming mode, data can be stored in memory array 11.

A standby mode of EPROM 10 is entered when the high voltage of Vcc is applied to chip enable input pin $\overline{CE}$. As described above, when EPROM 10 is in the standby mode, the power consumption of EPROM 10 is substantially reduced.

EPROM 10 includes a status CAM cell 18 in addition to CAM cells 12. Status CAM cell 18 stores information as to its own status. The function of status CAM 18 differs from the function of CAM cells 12. As discussed above, CAM cells 12 are used for configuration and redundancy use. In contrast, the logical state of status CAM cell 18 determines whether or not control circuitry 19 allows current to flow through CAM cells 12 during the standby mode.

Status CAM cell 18 uses the same type of circuit as one of the cells of CAM cells 12. As shown in FIG. 2, status CAM cell 18 is connected by line 24 to a control circuit 19. Control circuit 19 is in turn connected to CAM 12 via line 25. The signal on line 24 indicates whether status CAM cell 18 stores a logical one (i.e., the erased state) or whether status CAM cell 18 stores a logical zero (i.e., the programmed state).

When EPROM 10 enters the standby mode, chip enable input pin $\overline{CE}$ is applied to control circuit 19. This indicates to control circuit 19 that EPROM 10 is in its standby mode. Control circuit 19 then checks the signal on line 24 to see whether status CAM cell 18 stores a logical one (i.e., the erased state) or a logical zero (i.e., the programmed state). If status CAM cell 18 is in the erased state, then control circuit 19 issues a control signal to CAM cells 12 via line 25 that turns off the current flowing through each cell of CAM cells 12.

If, on the other hand, status CAM cell 18 has been programmed so that it stores a logical zero, then control circuitry 19 does not turn off the current flowing through each cell of CAM cells 12. Indeed, if status CAM cell 18 stores a logical zero, then control circuitry 19 does not perform any control function with respect to CAM cells 12.

Status CAM cell 18 includes an EPROM-type cell covered by a metal plate, so that status CAM cell 18 retains its logical zero state permanently once status CAM cell 18 is programmed. Therefore, once status CAM cell 18 is programmed, control circuitry 19 no longer performs any control function with respect to CAM cells 12 and will no longer turn off the current flowing through the cells of CAM cells 12.

When chip enable input $\overline{CE}$ goes to a logical zero voltage, then EPROM 10 exits from the standby mode. Control circuitry 19 sees the logical zero voltage at the $\overline{CE}$ input, and control circuitry 19 in turn issues a control signal on line 25 to CAM cells 12 that allows current to flow through CAM cells 12.

Status CAM 18 and control circuitry are relied upon during the testing of EPROM 10. In particular, status CAM 18 and control circuitry 19 are relied upon during the measurement of the standby current and standby power of EPROM 10.

After fabrication of EPROM 10, CAM cells 12 and status cell 18 will initially be in the erased state, which is the conducting state. Standby current of EPROM 10 is measurably greater if CAM cells 12 are conducting rather than not conducting. But in one embodiment, CAM cells 12 will be programmed after testing is completed, which will make them non-conducting and in turn decrease the standby current of EPROM 10. One of the goals, however, in testing EPROM 10 after fabrication and before shipment is to measure the amount of standby current and standby power of EPROM 10 that approximates the amount used by EPROM 10 after CAM cells 12 are programmed. Status cell 18 and control circuitry 19 provide a mechanism for accomplishing this task without the necessity of programming CAM cells 12 before testing occurs. Programming CAM cells 12 before testing is to be avoided. Programming can be time-consuming. Moreover, once CAM cells 12 are programmed, they cannot be returned to the erased state.

To test EPROM 10 for standby current, chip enable input pin $\overline{CE}$ is applied with the high voltage Vcc. This in turn places EPROM 10 into the standby mode. Control circuitry 19 senses that the standby mode has been entered (i.e., that the $\overline{CE}$ input pin is high) and that the status CAM is erased, and accordingly turns off the current in CAM cells 12. The standby current of EPROM 10 is then measured (using known current measuring techniques), and the standby power of EPROM 10 is calculated (using known methods of calculation).

Because the current in CAM cells 12 has been turned off at the time of measurement of the standby current, the programmed state—i.e., non-conducting state—of CAM cells 12 has been simulated without the necessity of programming CAM cells 12 before testing.

After the testing of EPROM 10 has been completed, status cell 18 is then programmed to store a logical zero. This prevents control circuitry 19 from in the future turning off the current in CAM cells 12. After the testing of EPROM 10 has been completed and status cell 18 has been programmed, status cell 18 is no longer useful. Programming status cell 18 to a logical zero prevents status cell 18 from drawing current.

After testing is completed, CAM cells 12 are programmed.

FIG. 3 illustrates circuitry of EPROM 10 that includes status CAM cell 18, control circuitry 19, CAM cells 12, bias circuit 32, and $\overline{CE}$ input buffer 31. The $\overline{CE}$ input buffer 31 is located between the chip enable input $\overline{CE}$ and control circuitry 19. $\overline{CE}$ input buffer 31 receives from the chip enable pin input signals that include a logic low signal and logic high signal. Input buffer 31 outputs a logic high signal to control circuitry 19 when the chip enable $\overline{CE}$ input pin at the Vcc voltage. The outputs of the cells of CAM cells 12 are connected to various internal circuits of EPROM 10 so that CAM cells 12 can provide configuration and redundancy functions.

Bias circuit 32 provides a constant 2 volt analog bias voltage UBIAS via line 37 to status CAM cell 18 and to each cell of CAM cells 12—namely, cells CELL 0, CELL 1, CELL 2, etc., through CELL n of CAM cells 12.

The UBIAS voltage is also applied as an input to control circuitry 19. Control circuit 19 generates a UBIAS1 signal that is also applied as an input to each CELL 0 through CELL n of CAM cells 12 via line 25.

When the UBIAS1 signal is at 0 volts, the current within erased CAM cells 12 is cut off. When the UBIAS1 is at approximately 2 volts, the current is allowed to flow through CAM cells 12.

In contrast, status CAM cell 18 is not affected by the level of the UBIAS1 signal. The UBIAS1 signal is not applied to status CAM cell 18.

Given that status CAM cell 18 is not affected or controlled by the UBIAS1 signal, an erased status CAM cell 18 (i.e., at the logical one level) continues to conduct during the period that the UBIAS1 signal is at 0 volts and each of the cells of CAM cells 12 is accordingly in the non-conducting state. The output of status CAM cell 18 changes only when status CAM cell 18 is programmed to a logical zero level.

Control circuitry 19 of FIG. 3 operates as follows. When EPROM 10 is to be placed in the standby mode, the Vcc voltage is applied to its chip enable pin $\overline{CE}$. The Vcc voltage signal is in turn fed to $\overline{CE}$ input buffer 31, which in turn produces a logical high signal that is applied to control circuitry 19.

Status CAM cell 18 is coupled to control circuitry 19 via line 36. An RSTATUS signal sent from status CAM cell 18 to control circuitry 19 indicates to control circuitry 19 whether status CAM cell 18 is in a logical one state (i.e., the erased state) or a logical zero state (i.e., the programmed state). If RSTATUS is logically high, then status CAM cell 18 is erased. If RSTATUS is logically low, then status CAM cell 18 has been programmed to store a logical zero.

If RSTATUS and the $\overline{CE}$ signal are both in the logical high state, then control circuitry 19 produces a 0 volts UBIAS1 signal that is applied to each of the cells of CAM cells 12. The 0 volts UBIAS1 signal in turn shuts off the current within each of the cells of CAM cells 12.

After status CAM cell 18 is programmed, status CAM cell 18 cannot be further altered. The resulting RSTATUS signal from status CAM cell 18 will be permanently logically low. Circuit 19 will in turn then send a high UBIAS1 signal to each CELL 0, CELL 1, CELL 2, etc., through CELL n of CAM cells 12 regardless of the $\overline{CE}$ input from input buffer 31. In this way, control circuitry 19 is disabled from generating a logic low UBIAS1 signal at its output side that would otherwise turn off currents in CAM cells 12.

FIG. 4 illustrates the circuitry of control circuit 19 and bias circuit 32. Control circuitry 19 includes AND gate 41 and an inverter that comprises a P-channel transistor 42 and an N-channel transistor 43. The source of the P-channel transistor 42 is connected to the bias voltage UBIAS supplied by bias circuit 32. The output voltage of the transistors 42 and 43 is the UBIAS1 signal. The UBIAS1 signal is either 0 volts or approximately 2 volts.

The bias circuit 32 shown in FIG. 4 is a bias voltage supply circuit made up of a P-channel transistor 44 and N-channel transistors 45 and 46. Bias circuit 32 produces a constant bias voltage UBIAS that is applied as to one of the inputs of each CAM 12 Cells. Bias voltage UBIAS is also applied as two inputs to status CAM cell 18. The UBIAS voltage of bias circuit 32 is also coupled to the source of the transistor 42.

AND gate 41 receives from status CAM cell 18 an RSTATUS signal (which is either logic "1" or "0") and a $\overline{CE}$ signal from $\overline{CE}$ input buffer 31 (which is either logic "1" or "0"). The output of AND gate 41 is connected to the inverter formed by the transistor 42 and 43. If both the RSTATUS and $\overline{CE}$ signals are in the logical one state, that means that EPROM 10 has entered the standby mode and CAM cells 12 have not been programmed. AND gate 41 will in turn generate a logical one on line 60. The logical one on line 60 is applied to the inverter formed by the transistors 42 and 43. The inverter produces a 0 volt UBIAS1 signal on line 25 that is sent to each of the cells of CAM cells 12. If, on the other hand, either $\overline{CE}$ or the RSTATUS signal is a logical zero, then the signal UBIAS1 on line 25 is a 2 volt analog signal.

FIG. 5 shows an example of a single CAM cell of CAM cells 12. FIG. 5 shows CAM CELL0 and the circuitry that allows the current to be turned off within a CAM cell of CAM cells 12.

The CAM cell of FIG. 5 includes a flip-flop structure formed by transistors 71, 73, 76, 78, 80, and 82. Transistors 71 and 73 are P-channel transistors. The gate of transistor 71 is coupled to the drain of transistor 73. The gate of transistor 73 is coupled to the drain of transistor 71. Transistors 76 and 78 are N-channel transistors. The drain of transistor 76 is coupled to the drain of transistor 71. The drain of transistor 78 is coupled to the drain of transistor 73. Line 25 carrying the UBIAS1 signal is coupled to the gate of transistor 76, and line 37 carrying the UBIAS signal is coupled to the gate of transistor 78.

The drain of P-channel transistor 73 coupled to the input of inverter 51. The output of inverter 51 is coupled to the input of inverter 52. The output of inverter 52 is coupled to the input of inverter 53. The output of inverter 53 is coupled to other circuitry of EPROM 10.

Connected to the respective sources of N-channel transistors 76 and 78 are two transistors 80 and 82. Transistors 80 and 82 are EPROM-type transistors, which are covered with a metal mask. The two transistors 80 and 81 are thus unerasable PROM transistors (i.e., UPROM transistors).

Transistor 77 is controlled by ENABLE 1 signal and is used to apply 12 volts to the drain of UPROM transistor 80 when transistor 80 is being programmed. Transistor 79 is controlled by an ENABLE signal and is used to apply 12 volts to the drain of UPROM transistor 82 when transistor 82 is being programmed.

Before being programmed, UPROM transistors 80 and 82 are each in their erased state, which is the logical one state. The logical one state means that currents can flow through transistors 80 and 82. To program the cell of FIG. 5, either transistor 80 or transistor 82 is programmed to a logical zero state. In the logical zero state, current cannot flow through that transistor.

If either transistor 80 or transistor 82 is programmed, then the drain of transistor 73 will be at either a low or a high voltage. A low or high voltage at the drain of transistor 73 means that a low or high signal is applied as an input to the string of inverters 51, 52, and 53. The output of inverter 53 is thus either logically high or low. No matter which transistor of transistors 80 and 82 is programmed, no current will flow through both transistors 80 and 82.

If transistors 80 and 82 are both in the erased state, the current in CAM cell shown in FIG. 5 is controlled by N-channel transistors 76 and 78. The on or off condition of transistors 76 and 78 is initially determined by their gate bias voltages UBIAS and UBIAS1. The UBIAS bias voltage is a constant voltage. Therefore, the voltage value of UBIAS1 (i.e., 2 volts or 0 volts) determines the circuit current through transistor 76. When the UBIAS1 is at 2 volts, then both transistors 76 and 78 are properly biased and are in the "on" condition. Because transistors 80 and 82 are in the logical one state, current will flow through both transistors 76 and 78. This means that there is a low voltage at the drain of transistor 73, which in turn means that a low voltage is applied to the input of inverter 51. The output of the string of inverters 51, 52, and 53 is therefore a logical high voltage.

If the UBIAS1 signal is at 0 volts, then transistor 76 will be turned off. Turning transistor 76 off raises the drain voltage of transistor 76, which in turn raises the gate voltage of transistor 73. Raising the gate voltage of transistor 73 turns transistor 73 off. Turning transistor 73 off lowers the drain voltage of transistor 73, which in turn means that a logical low voltage is applied to the input of inverter 51. A low voltage at the input to inverter 51 of the string of inverters 51, 52, and 53 results in a logical high voltage at the output of inverter 53.

FIG. 6 is a circuit diagram of status CAM cell 18. Status CAM cell 18 is comprised of P-channel CMOS transistors 101 and 103, N-channel CMOS transistors 106 and 108, and UPROM transistors 110 and 112. The circuitry of status CAM cell 18 is similar to that of CAM CELL0 shown in FIG. 5. One difference, however, is that the UBIAS signal on line 37 is applied to gates of both transistors 106 and 108. Thus the value of the UBIAS1 signal does not affect status CAM cell 18. In addition, the output of status CAM cell 18 is the RSTATUS signal on line 36.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A memory device, comprising:
   (a) a memory array;
   (b) a configuration cell for configuring the memory device with respect to memory device operation, wherein the configuration cell is coupled to various internal circuits of the memory device, wherein the configuration cell is initially in a first state and can selectably be placed into a second state, wherein once the configuration cell is placed into the second state, the configuration cell is impeded from returning to the first state;
   (c) a status cell that is initially in a third state and can selectably be placed into a fourth state, wherein once the status cell is placed into the fourth state, the status cell is impeded from returning to the third state; and (d) a control circuit coupled between the status cell and the configuration cell, wherein if the memory device is in a standby mode and the status cell is in the third state, then the control circuit turns off the current of the configuration cell.

2. The memory device of claim 1, wherein the third state of the status cell is an erased state and the fourth state is a programmed state.

3. The memory device of claim 1, wherein the status cell is a unerasable programmable read-only memory.

4. The memory device of claim 1, wherein the control circuit includes and AND gate coupled to an inverter 5. The memory device as claimed in claim 1, wherein the first state of the configuration bit is an erased state and the second state of the configuration bit is a programmed state.

* * * * *